US009473172B2

(12) United States Patent
Chieco et al.

(10) Patent No.: US 9,473,172 B2
(45) Date of Patent: Oct. 18, 2016

(54) RECEIVER DESERIALIZER LATENCY TRIM

(71) Applicant: GLOBALFOUNDRIES INC., Grand Cayman (KY)

(72) Inventors: Leonard R. Chieco, Hopewell Junction, NY (US); Frank R. Keyser, III, Colchester, VT (US); Michael A Sorna, Hopewell Junction, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 322 days.

(21) Appl. No.: 14/172,618

(22) Filed: Feb. 4, 2014

(65) Prior Publication Data

US 2015/0222377 A1 Aug. 6, 2015

(51) Int. Cl.
| | |
|---|---|
| H04J 3/06 | (2006.01) |
| H03M 9/00 | (2006.01) |
| H04L 1/00 | (2006.01) |
| H04J 3/04 | (2006.01) |
| H04L 7/00 | (2006.01) |
| H04L 7/04 | (2006.01) |

(52) U.S. Cl.
CPC .............. *H03M 9/00* (2013.01); *H04J 3/0682* (2013.01); *H04J 3/0685* (2013.01); *H04L 1/00* (2013.01); *H04J 3/047* (2013.01); *H04L 7/0008* (2013.01); *H04L 7/043* (2013.01)

(58) Field of Classification Search
CPC ............ G06F 1/10; G06F 1/12; H04J 3/047; H04J 3/0682; H04J 3/0685; H04L 1/00; H04L 7/043; H03L 7/0812; H03M 9/00
USPC ........ 370/324, 503, 516, 518; 375/224, 233, 375/327, 371, 376; 713/500, 400; 714/738
See application file for complete search history.

(56) References Cited

U.S. PATENT DOCUMENTS

| | | | |
|---|---|---|---|
| 6,430,201 B1 | 8/2002 | Azizoglu et al. | |
| 7,006,021 B1 | 2/2006 | Lombaard | |
| 7,366,267 B1 | 4/2008 | Lee et al. | |
| 7,409,616 B1 * | 8/2008 | Sardi ................ | G01R 31/31715 |
| | | | 714/736 |

(Continued)

FOREIGN PATENT DOCUMENTS

EP 2355398 8/2013

OTHER PUBLICATIONS

Baker, E. "The Design of a CMOS Sensor Camera System for a Nanosatellite" Department of Electric and Electronic Engineering, University of Stellenbosch. Oct. 2006. (143 Pages).

(Continued)

*Primary Examiner* — Anh Ngoc Nguyen
*Assistant Examiner* — Harun Chowdhury
(74) *Attorney, Agent, or Firm* — Hoffman Warnick LLC; Yuanmin Cai

(57) ABSTRACT

A system and method for receiving includes an input multiplexer configured to select between one or more input data streams and a pseudo random bit sequence (PRBS) to provide a serial stream. A plurality of storage devices is configured to sample the serial stream. An output demultiplexer is configured to demultiplex the sampled serial stream into a plurality of output streams. A PRBS checker is configured to compare a PRBS pattern on the plurality of output streams with a predicted PRBS pattern. A phase rotator is configured to adjust a data control clock based upon the comparison of the PRBS checker to reduce latency in the receiver.

18 Claims, 3 Drawing Sheets

(56) References Cited

U.S. PATENT DOCUMENTS

| | | | |
|---|---|---|---|
| 8,415,980 | B2 | 4/2013 | Fiedler |
| 8,483,344 | B2 | 7/2013 | Dillinger |
| 2009/0310667 | A1* | 12/2009 | Lee .................. H03L 7/0814 375/233 |
| 2010/0237925 | A1* | 9/2010 | Lin .................. H03K 3/35613 327/299 |
| 2011/0191619 | A1 | 8/2011 | Morrison et al. |
| 2011/0304369 | A1* | 12/2011 | Hu .................. H03L 7/0814 327/161 |
| 2013/0027229 | A1 | 1/2013 | Denham |
| 2013/0170591 | A1 | 7/2013 | Su |
| 2014/0355658 | A1* | 12/2014 | Meier .................. H04L 1/244 375/224 |

OTHER PUBLICATIONS

Gui, P. et al. "A Source-Synchronous Double-Data-Rate Parallel Optical Transceiver IC" IEEE Transactions on Very Large Scale Integration (VLSI) Systems, vol. 13, No. 7. Jul. 2005. pp. 833-842.

Manoharan, M. "A High Bandwidth Area Efficient Spatial Divison Multiplexing Based Network on Chip" Department of Electrical & Computer Engineering Faculty of Engineering, National University of Singapore. Nov. 2010. (51 Pages).

* cited by examiner

RECEIVER DESERIALIZER LATENCY TRIM

CROSS-REFERENCE TO RELATED APPLICATIONS

This application is related to commonly assigned U.S. application Ser. No. 14/172,618, entitled TRANSMITTER SERIALIZER LATENCY TRIM, filed concurrently herewith, incorporated herein by reference in its entirety.

BACKGROUND

1. Technical Field

The present invention relates to the reduction of latency of a serializer and deserializer, and more particularly to latency trim using pseudo random bit sequence generation and checking for a serializer and deserializer.

2. Description of the Related Art

Serial communication is the process of sending data one bit at a time, sequentially, over a communications channel. A serializer receives parallel data and creates a single stream with N-times the speed. A deserializer receives the serial data and creates a parallel bus of data, N-times the width. The latency of a serializer/deserializer is one of several key performance metrics. Serializer latency is the amount of time from the rising edge of the clock that captures the parallel data into the serializer to the time the first bit is transmitted out of the transmitter. Deserializer latency is the amount of time from the capture of the first bit at the input of the receiver to the rising edge of the clock outputting the parallel data out of the deserializer. Lower latencies are preferable and many designs count on low latency. In the design of a serializer/deserializer, there is a trade-off between minimizing latency and digital timing margin of the constituent latches involved in the serialization.

SUMMARY

A receiver includes an input multiplexer configured to select between one or more input data streams and a pseudo random bit sequence (PRBS) to provide a serial stream. A plurality of storage devices is configured to sample the serial stream. An output demultiplexer is configured to demultiplex the sampled serial stream into a plurality of output streams. A PRBS checker is configured to compare a PRBS pattern on the plurality of output streams with a predicted PRBS pattern. A phase rotator is configured to adjust a data control clock based upon the comparison of the PRBS checker to reduce latency in the receiver.

A receiver includes an input multiplexer configured to select between one or more input data streams and a pseudo random bit sequence (PRBS) to provide a serial stream. A plurality of storage devices is configured to sample the serial stream. An output demultiplexer is configured to demultiplex the sampled serial stream into a plurality of output streams according to a data deserializer clock. A PRBS checker is configured to compare a PRBS pattern on the plurality of output streams with a predicted PRBS pattern. A phase rotator is configured to adjust a data control clock based upon the comparison of the PRBS checker to reduce latency in the receiver by moving the data control clock in time relative to the data deserializer clock A method for receiving includes selecting between one or more input data streams and a pseudo random bit sequence (PRBS) to provide a serial stream. The serial stream is sampled using a plurality of storage devices. The sampled serial stream is demultiplexed into a plurality of output streams. A PRBS pattern on the plurality of output streams is compared with a predicted PRBS pattern. A data control clock is adjusted based upon the comparing to reduce latency in the receiver.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
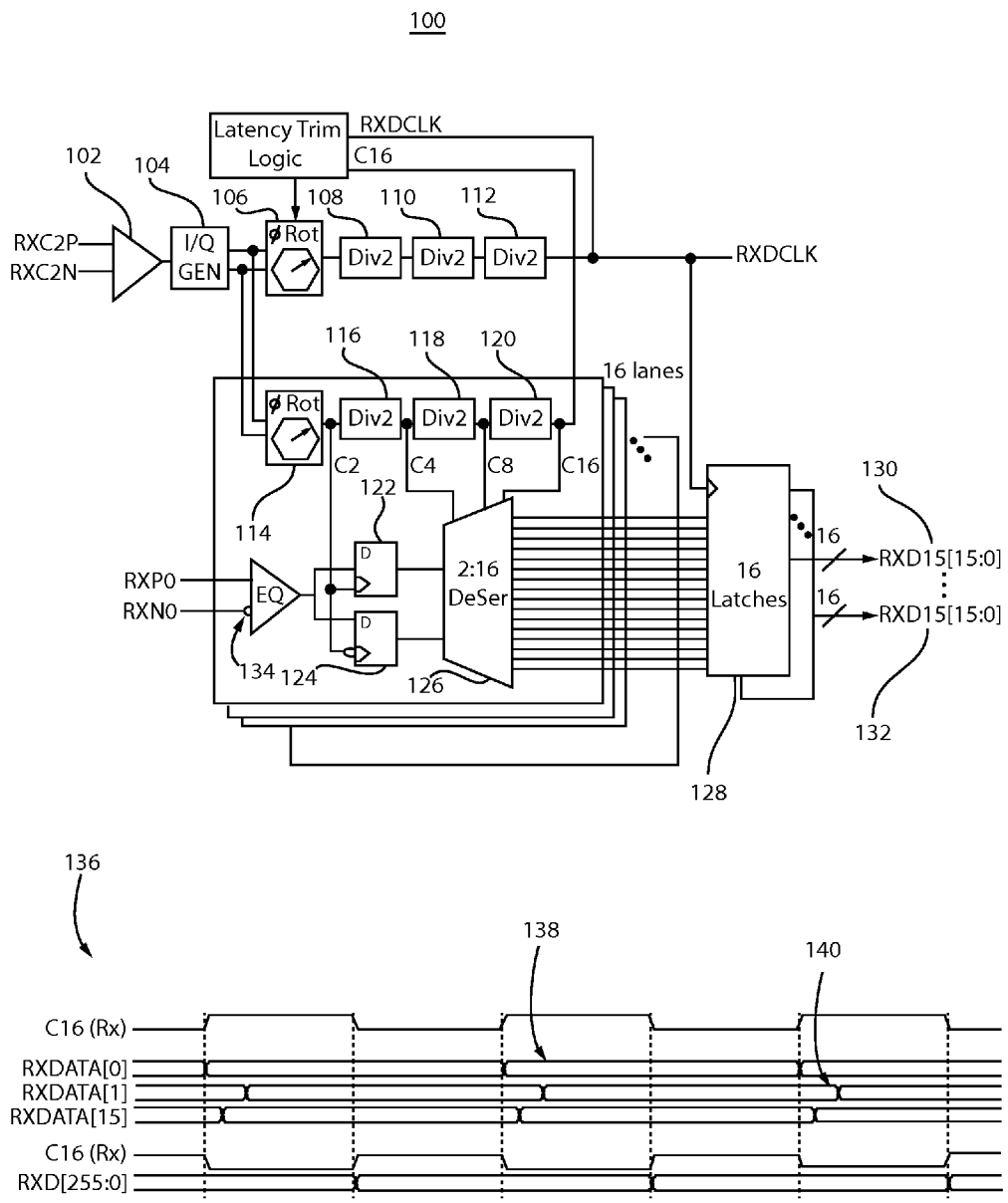
FIG. 1 is a block/flow diagram showing a high-level overview of a receiver, in accordance with one illustrative embodiment.

In accordance with the present principles, systems, methods and a computer program product (e.g., simulators) for reducing latency in a receiver (e.g., deserializer) are provided. The present principles provide a means of minimizing latency of a receiver serializer by employing a combination of both a pseudo random bit sequence (PRBS) generator and a PRBS checker. The PRBS generator is employed to generate a PRBS. A PRBS is a sequence that appears to be perfectly random, but repeats with a periodic cycle time. An input multiplexer selects between the input data source and the PRBS. Separate phase rotators are employed for generating the data control clock and the data deserializer clock, respectively. As such, the timing difference between the data control clock and the data deserializer clock can be controlled via the phase rotators.

The PRBS checker compares a PRBS pattern from the output of an output multiplexer with a predicted PRBS pattern. An optimal latency can be achieved using PRBS generation/PRBS checking to determine the point in time when latency starts to cause errors. The value of the phase rotator can then be adjusted to delay the data deserializer clock relative to the data control clock, moving the deserializer from this error state by a desired margin.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a block/flow diagram showing a high-level overview of a receiver 100 is illustratively depicted in accordance with one embodiment. The receiver 100 preferably includes a deserializer. The receiver 100 receives input signals RXC2P and RXC2N from a transmitter (e.g., a transmit serializer). The receiver 100 is source-synchronous such that the clock is generated by the transmitter core and transported along with the data.

The clock enters the receiver 100 via the input signals RXC2P and RXC2N into clock receiver 102. In-phase and quadrature clocks are created by in-phase and quadrature (I/Q) generator 104 to provide four total phases (e.g., 0, 90, 180 and 270 degrees). These clocks go into two sets of phase rotators: a first phase rotator 106 for the RXDCLK path and a second phase rotator 114 for each lane. After phase rotation by phase rotator 106, a cascade of ripple divide by two dividers 108, 110, 112 provide the RXDCLK signal, which is 1/8th of the input C2 clock (i.e., 1/16th the Baud rate). Note that RXDCLK signal is inverted at the output of the final divider 112. In the nomenclature $C_z$, z is the sub rate below the baud rate. For example, C16 is 1/16th the baud rate. At 15 Gb/s, C16=937.5 MHz clock frequency.

In the lane path, the second phase rotator 114 is used along with a cascade of divide by two dividers 116, 118, 120 to create the desired C2, C4, C8 and C16 clock phases. The C2 clock is used to sample the incoming data RXP0 and RXN0 from a transmitter at sample latches 122, 124. Incoming P and N data are part of the true and compliment signals of differential data. Note that latch 122 captures data on the rising edge of the C2 clock, whereas latch 124 captures data on the falling edge of the C2 clock (due to the inverter at the input of latch 124).

The two data bits are then sent into the 2:16 demultiplexer 126 where the data is aligned and clocked out with the data deserializer clock C16 phase (rising edge). In this design, there are 16 separate lanes with 16 bits total output. Thus, the output to the customer logic 130 through 132 forms a bundle of 256 wires (i.e., 16 lanes×16 bits/lane) to provide the original customer data.

Since each lane has a separate phase rotator, there can be significant skew (up to 2 bit times or Unit Intervals), which detracts from customer timing. To solve this problem, a set of re-timing latches 128 are added to recapture the data onto a single clock domain, that of RXDCLK. Note that divider 112 has an inverter as its output. This indicates the plan of record for the RXDCLK where an 8 UI delay is associated with the collapsing of the multiple clock domains into a single clock domain. The present invention seeks to minimize this delay.

The receiver 100 is associated with timing diagram 136. RXDATA[0] shows the earliest progression 138 of the data presented to the customer logic on TXDCLK. RXDATA[0] is aligned to the rising edge of the clock C16(Rx), RXDATA[1] is aligned to the rising edge of clock RXDCLK[1], etc. The variation 140 in the phase of, e.g., the RXDCLK[0] clock and the RXDCLK[1] clock shows the variation in clock placement. The difference between the earliest and latest clocks must be less than 2 UI based on the architecture. The RXDCLK[15] clock shows the median variation in the clock position.

Figure 2:
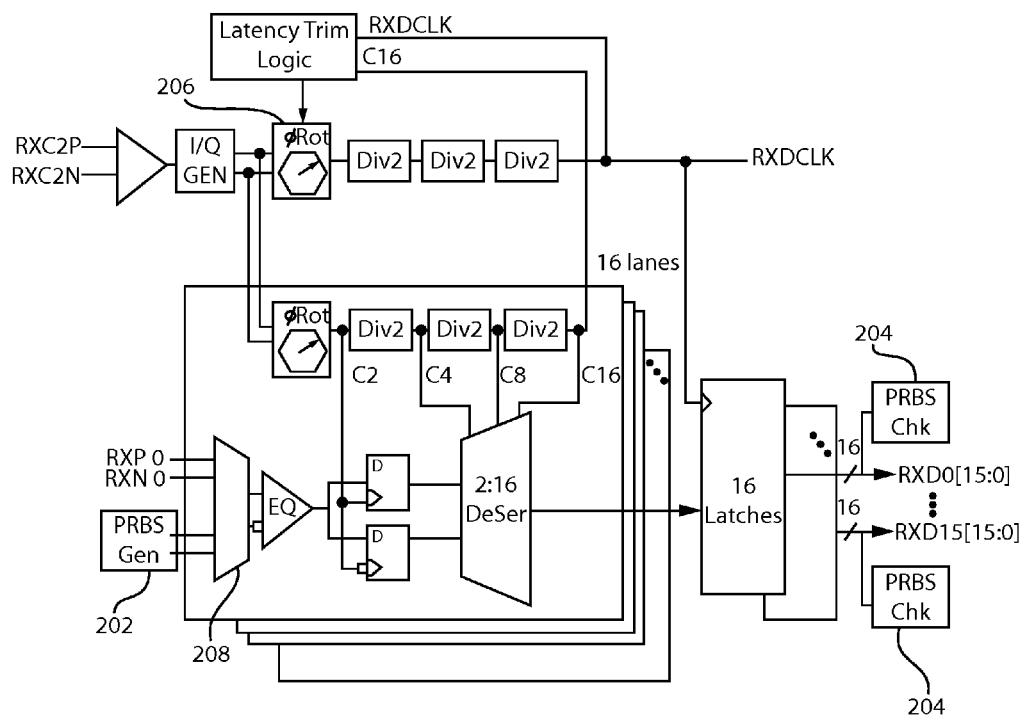
FIG. 2 is a block/flow diagram showing a receiver with pseudo random bit sequence generation and checking for the reduction of latency, in accordance with one illustrative embodiment.

Referring now to FIG. 2, a block/flow diagram showing a receiver with PRBS generation/checking 200 is illustratively depicted in accordance with one embodiment. The nominal clock skew is used as a starting point for the latency skew baseline but a minimization is done. At power up, the data control clock RXDCLK is aligned to be 180 degrees offset from the C16 lanes. This introduces a nominal 8 UI latency to the RXD outputs. The present invention minimizes the latency of the receiver by minimizing the difference between the data deserializer clock C16 (C16CLK) and the associated data control clock RXDCLK.

The receiver 200 modifies the receiver 100 with a number of important modifications. The receiver 200 employs a combination of both a PRBS generator 202 and a PRBS checker 204. The input multiplexer MUX 208 selects between the input data source (RXP0/RXN0) and the PRBS. PRBS checking 204 can be employed to determine when latency causes errors. The phase rotator can then be adjusted to provide sufficient margin.

The PRBS generator 202 generates PRBS. A PRBS is a sequence that appears to be perfectly random, but repeats with a periodic cycle time. The input multiplexer 208 selects between the input data streams, RXP0 and RXN0, and the PRBS to create a serial stream used to exercise the receiver 200. The receive path captures the PRBS generated serial stream and deserializes the data into a 16 bit wide bus.

The PRBS check 204 is a self-priming design, which captures a single 16 bit wide word and uses this as a seed for the PRBS checker 204. The seed is used to prime the checker, which generates 16 bit wide predictive PRBS patterns with which to check the incoming data against. The PRBS check 204 compares a PRBS pattern on the output with a predicted PRBS pattern. If the data matches for a few cycles, the PRBS SYNC signal is raised indicating that the incoming data is understood and synchronized. The PRBS generator 202 then checks the incoming data bit by bit after synchronization. If any of the subsequent data does not match the PRBS checker 204 data, the PRBSERROR signal is raised. The PRBSERROR signal is a "sticky bit," where any single bit error sets the PRBSERROR signal and it remains enabled until the PRBS Checker 204 is reset.

The initial alignment of the data control clock RXDCLK to the data deserializer clock C16CLK renders an 8 UI skew in the delay. The receiver latency trim operates by starting at the 8 UI skew and sequentially reducing the skew between the data deserializer clock C16CLK and the data control clock RXDCLK by modifying the value of the phase rotator 206 to move the data control clock RXDCLK in time relative to the data deserializer clock C16CLK. The state machine sequentially reduces the data control clock RXDCLK delay by decreasing the value of the phase rotator 206 of the RXDCLK path until the point where the PRBS checker 204 starts registering errors.

The receiver 200 cannot operate in this error condition. To compensate, the phase rotator 206 is adjusted to move the data control clock RXDCLK from the error condition. Preferably, the phase rotator 206 is adjusted to move the data control clock RXDCLK further to the right by the amount of the receiver setup time margin, Rx_Tsu_margin. The setup time margin describes the amount of time the data can arrive before the clock and the latches/flip-flops will capture the appropriate data. This value may be programmed by the user in phase rotator steps. Normally this value should be set to accommodate the amount of skew/jitter present in the system. A reasonable goal might be 2 UI. A detailed jitter budget should be formulated which accounts for all the jitter/skew terms and provides adequate system margin.

In the design of the logic, a programmable control bit should be provided to prevent receiver latency trim from running, resulting in an 8 UI penalty in the latency of the system. Also, the amount of Rx_Tsu_margin should be programmable in the range of +/−1 UI (covering the full 2 UI phase rotator offset range).

The receiver 200 provides a scheme for reducing latency. Advantageously, the PRBS generator 202 and PRBS checking 204 are typically already present to support manufacturing testing. Thus, no additional logic is needed to enable the latency trim function.

Figure 3:
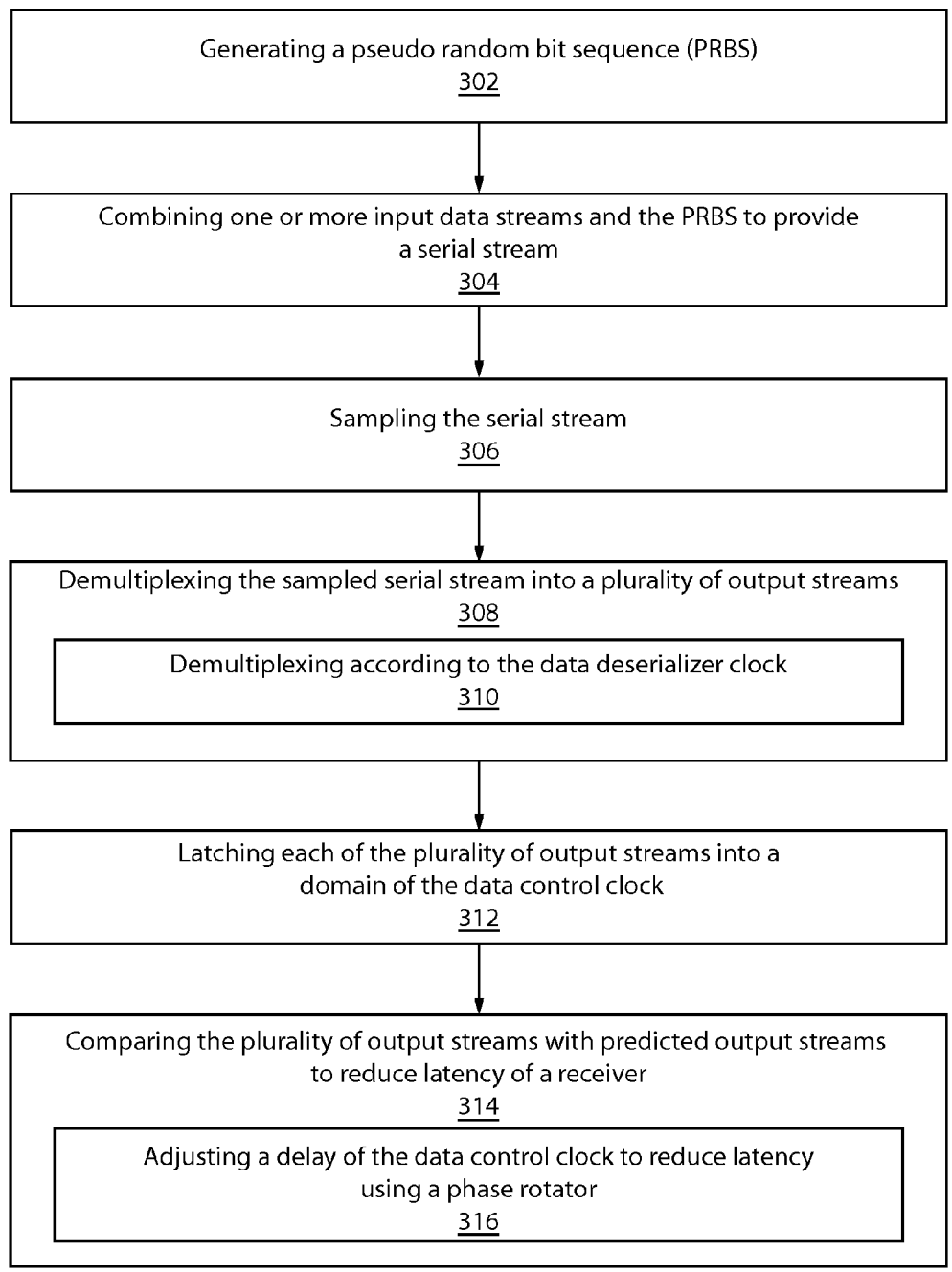
FIG. 3 is a block/flow diagram showing a method for receiving, in accordance with one illustrative embodiment.

Referring now to FIG. 3, a block/flow diagram showing a method for receiving 300 is illustratively depicted in accordance with one embodiment. The method 300 may be employed to reduce latency in a deserializer. In one embodiment, the method for receiving 300 may be embodied in a computer program product, such as, e.g., a simulator.

In block 302, a pseudo random bit sequence is generated. A PRBS is a sequence that appears to be perfectly random, but then repeats with a periodic cycle time. In block 304, one or more input data streams are combined with the PRBS to provide a serial stream. An input multiplexer is configured to select between the one or more input data streams and the PRBS. In block 306, the serial stream is sampled. Sampling the serial stream may involve a plurality of storage devices or latches. In block 308, the sampled serial stream is demultiplexed into a plurality of output streams. Demultiplexing is performed according to the data deserializer clock in block 310.

In block 312, the plurality of output streams are latched. Latching recaptures the data into a single clock domain, preferably that of the data control clock. In block 314, PRBS patterns of the plurality of output streams are compared with predicted PRBS output streams to reduce latency of the receiver. Comparing may involve a PRBS checker. The PRBS checker is preferably self-priming, such that the incoming data is used as a seed to prime the checker to generate the predicted PRBS patterns. Where there is a discrepancy, an error signal is raised and held until a reset is applied. Comparing may include adjusting a delay of the data control clock to reduce latency of the receiver by adjusting a value of the phase rotator, in block 316.

In a preferred embodiment, the initial alignment of the data control clock and data deserializer clock renders an 8 UI offset. Latency trim operates to sequentially reduce the skew between the data control clock and the data deserializer clock by modifying the value of the phase rotator of the data control clock. The state machine thus sequentially reduces the delay of the data control clock by adjusting its phase rotator until the point where the PRBS checker registers an error. The phase rotator of the data control clock is then adjusted to move the data control clock out of this error state by a desired amount.

Having described preferred embodiments of a system and method for receiver deserializer latency trim (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A receiver, comprising:
   an input multiplexer configured to select between one or more input data streams and a pseudo random bit sequence (PRBS) to provide a serial stream;
   a plurality of storage devices configured to sample the serial stream;
   an output demultiplexer configured to demultiplex the sampled serial stream into a plurality of output streams;
   a PRBS checker configured to:
      compare a PRBS pattern on the plurality of output streams with a predicted PRBS pattern, and generate an error signal bit in response to a discrepancy being detected between the PRBS pattern and the predicted PRBS pattern; and
   a phase rotator for reducing latency in the receiver by being configured to:

sequentially reduce skew between a data control clock and a data deserializer clock until the PRBS checker generates the error signal bit based upon the comparison of the PRBS checker, and adjust the data control clock by a predetermined amount to eliminate the discrepancy.

2. The receiver as recited in claim 1, further comprising a first cascade of dividers having an inverter at its output to provide the data control clock and a second cascade of dividers to provide the data deserializer clock.

3. The receiver as recited in claim 2, wherein the PRBS checker is further configured to assess timing between the data control clock and the data deserializer clock.

4. The receiver as recited in claim 2, wherein the data control clock and the data deserializer clock are initially aligned to be 180 degrees offset.

5. The receiver as recited in claim 1, wherein the output demultiplexer is clocked according to the data deserializer clock.

6. The receiver as recited in claim 1, wherein the PRBS checker is further configured to generate the error signal bit until a reset is applied to the PRBS checker, after the phase rotator adjusts data control clock by the predetermined amount.

7. The receiver as recited in claim 1, further comprising a plurality of latches for each of the plurality of output streams configured to capture the plurality of output streams into a single clock domain.

8. The receiver as recited in claim 1, further comprising a PRBS generator configured to generate the PRBS.

9. The receiver as recited in claim 1, wherein the PRBS checker is self-priming.

10. A method for reducing receiver latency, the method comprising:

selecting between one or more input data streams and a pseudo random bit sequence (PRBS) to provide a serial stream;

sampling the serial stream using a plurality of storage devices;

demultiplexing the sampled serial stream into a plurality of output streams;

comparing, using a PRBS checker, a PRBS pattern of the plurality of output streams with a predicted PRBS pattern, wherein the PRBS checker is configured to generate an error signal bit in response to a discrepancy being detected between the PRBS pattern and the predicted PRBS pattern;

sequentially reducing skew between a data control clock and a data deserializer clock, using a phase rotator, until the PRBS checker generates the error signal bit based upon the comparing; and adjusting the data control clock with the phase rotator by a predetermined amount to eliminate the discrepancy.

11. The method as recited in claim 10, further comprising providing the data control clock using a first cascade of dividers having an inverter at its output and providing the data deserializer clock using a second cascade of dividers.

12. The method as recited in claim 11, wherein comparing includes assessing timing between the data control clock and the data deserializer clock.

13. The method as recited in claim 11, wherein the data control clock and the data deserializer clock are initially aligned to be 180 degrees offset.

14. The method as recited in claim 10, wherein the demultiplexing is clocked according to the data deserializer clock.

15. The method as recited in claim 10, further comprising applying a reset to the PRBS checker to cancel the error signal bit after adjusting the data control clock by the predetermined amount.

16. The method as recited in claim 10, further comprising capturing the plurality of output streams into a single clock domain.

17. The method as recited in claim 10, further comprising generating the PRBS.

18. The method as recited in claim 10, wherein the PRBS checker is self-priming.

* * * * *